United States Patent
Tsuji et al.

(10) Patent No.: US 6,905,978 B2
(45) Date of Patent: Jun. 14, 2005

(54) METHOD OF FORMING INTERLAYER INSULATION FILM

(75) Inventors: Naoto Tsuji, Tama (JP); Yukihiro Mori, Tama (JP); Satoshi Takahashi, Tama (JP); Ryo Kawaguchi, Tama (JP)

(73) Assignee: ASM Japan K.K., Tokyo (JP)

( * ) Notice: Subject to any disclaimer, the term of this patent is extended or adjusted under 35 U.S.C. 154(b) by 141 days.

(21) Appl. No.: 10/390,451

(22) Filed: Mar. 17, 2003

(65) Prior Publication Data

US 2003/0181069 A1 Sep. 25, 2003

(30) Foreign Application Priority Data

Mar. 20, 2002 (JP) .......................... 2002-079055

(51) Int. Cl.⁷ .............................................. H01L 21/31
(52) U.S. Cl. ........................................ 438/758; 438/770
(58) Field of Search ................................ 438/758, 770, 438/760

(56) References Cited

U.S. PATENT DOCUMENTS 6,287,889 B1 * 9/2001 Miyake et al. .............. 438/105
6,432,846 B1 * 8/2002 Matsuki ...................... 438/790
6,723,664 B2 * 4/2004 Matsumura et al. ........ 438/788
6,759,344 B2 * 7/2004 Matsuki et al. ............. 438/758

* cited by examiner

Primary Examiner—Michael S. Lebentritt
Assistant Examiner—Olivia T. Luk
(74) Attorney, Agent, or Firm—Knobbe Martens Olson & Bear, LLP

(57) ABSTRACT

A method of forming an interlayer insulation film on a semiconductor substrate using plasma CVD includes introducing a source gas into a reaction chamber, applying radio-frequency power after the source gas is brought in, introducing an oxidizing gas with or without an additive gas into the reaction chamber after the completion of supplying the source gas and applying the radio-frequency power, and applying the radio-frequency power again. The concentration of the oxidizing gas may be 0.3% or higher and a processing time period by the oxidizing gas may be three seconds or longer.

25 Claims, 2 Drawing Sheets

METHOD OF FORMING INTERLAYER INSULATION FILM

BACKGROUND OF THE INVENTION

1. Field of the Invention

The present invention relates to a method of forming an interlayer insulation film used for multilayer interconnects and particularly relates to a method of forming an interlayer insulation film having a low dielectric constant, high mechanical strength, and low water-repellency.

2. Description of the Related Art

In semiconductor integrated circuits, miniaturization has been pursued in response to demands on increased chip speed and performance. In the past, aluminum had been used as a material for multilayer interconnects. As interconnects had become minute and long, current densities had increased relatively, causing electromigration during use. Because aluminum has comparatively high electric resistivity, a problem with signal delay also occurred.

Consequently, copper having high resistance to disconnections and comparatively small electric resistivity was brought to attention in place of aluminum. In 1997, Cu trench filling interconnect technology called "Dual-Damascene" was developed by IBM and Motorola. Different from conventional methods in which an interlayer is filled with an insulation film after an interconnect is formed by processing an Al film convexly by etching, in this technology, an interconnect is formed by: An interlayer insulation film is trench-etched, a Cu thin film is electroplated/deposited on the entire surface, the copper is polished by the Chemical Mechanical Polishing (CMP) process so that the copper remains only in a trench portion.

In the Damascene interconnect technology, application of a low-k insulation film is essential for solving signal delay problems. As low-k insulation films, there are, for example, an inorganic SOG (silicon oxide glass) film deposited by a spin coat process, a fluorinated amorphous carbon film deposited by plasma CVD using CxFyHz as a source gas, or a SixCyOx film deposited by plasma CVD using silicon hydrocarbon as a source gas and others. Of these low-k films, the SixCyOx film is most preferable as it possesses both a low dielectric constant and mechanical strength.

SUMMARY OF THE INVENTION

The SixCyOx film, however, has a property that its surface exhibits hydrophobicity because it contains many —CHx bonds. Because a liquid containing OH groups is used as a polishing fluid (slurry) in a CMP process, which is a post-process of a process of forming an insulation film, the polishing fluid does not blend in with a surface sufficiently if the surface of an insulation film has high water-repellency and low hydrophobicity. As a result, a problem in uneven polishing is caused.

If a device for the post-process is provided separately so as to lower water-repellency of the insulation film surface, it creates problems in device space and cost points of view.

The present invention has been achieved in light of these problems. An object of the present invention is to provide a method of forming an interlayer insulation film with high mechanical strength and low surface water-repellency.

Another object of the present invention is to provide a method of forming an interlayer insulation film with low manufactures' costs and high throughput.

To achieve the above-mentioned objects, among others, the present invention provides various embodiments including a method of forming an insulation film on a semiconductor substrate using plasma CVD, which comprises the steps of: (a) forming an insulation film on a semiconductor substrate placed in a reaction chamber by introducing a source gas and applying radio-frequency power; and (b) at completion of the formation of the film, introducing an oxidizing gas into the reaction chamber and applying radio-frequency power to increase hydrophilicity of a surface of the resulting insulation film. According to this embodiment, hydrophobic Si—H bonds and C—H bonds present on a surface of the insulation film can be converted to hydrophilic Si—OH bonds and C—OH bonds, respectively, thereby increasing hydrophilicity of the surface. The insulation film may have a low dielectric constant, high mechanical strength and low surface water-repellency.

In an embodiment, the insulation film can be used for various purposes and may suitably be used as an interlayer insulation film, and the method may further comprise subjecting the surface of the insulation film to chemical mechanical polishing (CMP). With this film, in the CMP process of the Damascene interconnect technology, polishing can be performed evenly, and reliability of the interlayer insulation film can be improved.

In the above, the present invention further includes, but are not limited to, the following embodiments: The oxidizing gas may be introduced with an additive gas. The source gas may be introduced with an additive gas or inert gas such as Ar, He, Ne, and $N_2$. No or little oxidizing gas may be used in step (a) so that step (a) forms as the insulation film a siloxan polymer or oligomer, but not a silicon oxide film. Step (b) may be initiated immediately after step (a). Step (b) may be initiated immediately prior to the completion of step (a). The method may further comprise evacuating the reaction chamber after step (a) before step (b). Step (b) may be conducted for at least one second including 2, 3, 5, 10, 20, 30, 40, 50, 60, 100, and 200 seconds, and a range including any of the forgoing (preferably approximately 3–60 seconds, further preferably approximately 3–30 seconds). A ratio of the radio-frequency power in step (b) to that in step (a) may be at least 1/20 including 1/15, 1/10, 1/5, 1/1, and 2/1, and a range including any of the forgoing (preferably about 1/10 to about 1/1). High power is preferable. In step (b), the radio-frequency power may be at least 150 mW/cm$^2$, preferably at least 250 mW/cm$^2$ or any power corresponding to the above ratio provided that the radio-frequency power in step (a) is 2.5 W/cm$^2$. Step (b) may continue until a contact angle to water of the surface of the insulation film becomes 50° or lower, including 40°, 30°, 20°, 10°, and 5°, and a range including any of the forgoing. In step (b), the oxidizing gas may be used at a concentration of at least 0.1%, including 0.5%, 1%, 5%, 10%, 20%, 50%, 80%, and 100%, and a range including any of the forgoing (preferably approximately 0.3%–100%).

In embodiments, any suitable source gas can be used which give the above characteristics, such as those disclosed in U.S. patent application Ser. No. 10/317,239 filed Dec. 11, 2002, which is herein incorporated by reference in its entirety.

In embodiments, the insulation film having low water repellency may have a dielectric constant of 3.5 or lower, preferably 3.1 or lower; and a hardness of 0.5 GPa or higher, preferably 1.0 GPa or higher.

In embodiments of the present invention, an interlayer insulation film with low manufactures' cost and high throughput can be formed. Such embodiments include, but are not limited to, the above-described embodiments and the embodiments described later.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

Explanations of symbols used in the figures are as follows: 1: Plasma CVD equipment; 2: heater; 3: Susceptor; 4: Semiconductor wafer; 5: Source gas inlet port; 6: Reaction chamber; 7: Primary radio-frequency power source; 8: Secondary radio-frequency power source; 9: Showerhead; 10: Exhaust port; 11: Grounding.

DETAILED DESCRIPTION OF THE PREFERRED EMBODIMENT

As explained above, in the present invention, various embodiments can be performed including the following specific examples:

A method of forming an interlayer insulation film on a semiconductor substrate using plasma CVD, comprises the steps of: (i) introducing a source gas into a reaction chamber; (ii) applying radio-frequency power after the source gas is brought in; (iii) introducing an oxidizing gas with or without an additive gas into the reaction chamber after supplying the source gas and applying the radio-frequency power; and (iv) reinitiating radio-frequency power.

A method of forming an interlayer insulation film on a semiconductor substrate using plasma CVD, comprises the steps of: (i) introducing a source gas into a reaction chamber; (ii) applying radio-frequency power after the source gas is brought in; and (iii) introducing an oxidizing gas with or without an additive gas into the reaction chamber simultaneously with completion of supplying the source gas.

A method of forming an interlayer insulation film on a semiconductor substrate using plasma CVD, comprises the steps of: (i) introducing a source gas into a reaction chamber; (ii) applying radio-frequency power after the source gas is brought in; (iii) progressively decreasing supply of the source gas; and (iv) introducing an oxidizing gas with or without an additive gas into the reaction chamber by progressively increasing a feed rate of the oxidizing gas with or without the additive gas as a feed rate of the source gas decreases.

A method of forming an interlayer insulation film on a semiconductor substrate using plasma CVD, comprises the steps of: (i) introducing a source gas into a reaction chamber; (ii) applying radio-frequency power after the source gas is brought in; and (iii) introducing an oxidizing gas with or without an additive gas into the reaction chamber immediately before completion of supplying the source gas and applying the radio-frequency power.

In the above, the source gas may comprise dimethyl dimethoxysilane (DM-DMOS), or the source gas may further comprises 1,2-propanediol.

Further, the oxidizing gas may comprise at least one selected from the group consisting of oxygen, dinitrogenoxide, ozone, hydrogen peroxide, carbon dioxide, and alcohol.

In embodiments, the oxidizing gas may have a concentration of 0.3% to 100%. The introduction of the oxidizing gas may continue for three seconds to 60 seconds. The additive gas may be He, Ar or $N_2$. The alcohol may be $CH_3OH$, $C_2H_5OH$, or $CH_3CH(OH)CH_2$.

Figure 1:
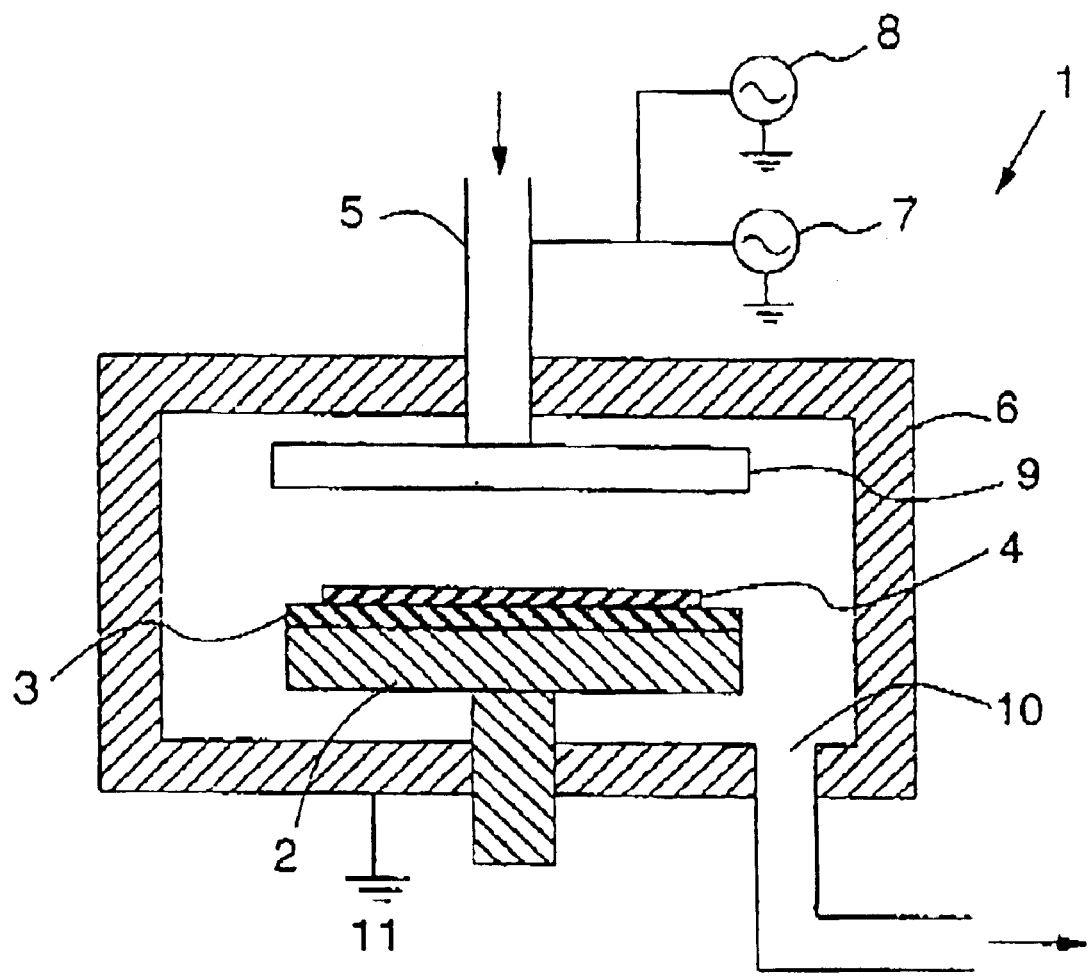
FIG. 1 is a schematic view of plasma CVD equipment usable for methods of forming an interlayer insulation film according to the present invention.

The present invention is described in detail by referring to figures. The present invention should not be limited thereto. FIG. 1 is a schematic view of plasma CVD equipment usable for methods of forming an interlayer insulation film having a low dielectric constant, high mechanical strength and low water-repellency according to the present invention. The plasma CVD equipment 1 includes a reaction chamber 6. Inside the reaction chamber 6, a susceptor 3 for placing a semiconductor wafer 4 thereon is provided. The susceptor 3 is coupled with a heater 2. The heater 2 keeps the semiconductor wafer 4 at a given temperature (e.g., 350 to 450° C.). The susceptor 3 serves also as one electrode for plasma discharge and is grounded 11 through the reaction chamber 6. On the ceiling inside the reaction chamber 6, a showerhead 9 is provided in parallel to and opposed to the susceptor 3. The showerhead 9 has many fine pores on its bottom surface, from which a jet of source gas described below is emitted to the semiconductor wafer 4. In the center of the showerhead 9, a source gas inlet port 5 is provided, and the source gas is brought in through a gas line (not shown) to the showerhead 9. The gas inlet port 5 is electrically insulated from the reaction chamber 6. The showerhead 9 serves also as the other electrode for plasma discharge and is connected to an external primary radio-frequency power source 7 and the external secondary radio-frequency power source 8 through the source gas inlet port 5. With this setup, a plasma reaction field is generated in the proximity of the semiconductor wafer 4. On the bottom surface of the reaction chamber 6, an exhaust port 10 is provided and is linked to an external vacuum pump (not shown).

In an embodiment, the above-mentioned source gas may comprise a main source gas, a sub-source gas and an additive gas. In the present invention, further, an oxidizing gas is involved for purposes of surface treatment of an insulation film. The main source gas may be silicon hydrocarbon containing multiple alkoxies, preferably DM-DMOS (dimethy-dimethoxysilane), etc. The sub-source gas may be $CO_2$, alcohol such as 1, 2 propanediol, hydrocarbon containing one or more unsaturated bond, or $N_2O$, and $O_2$ or $N_2O$ if controlling a Si/O ratio is required. The additive gas may be Ar and/or He. The oxidizing gas may be oxygen, dinitrogenoxide, ozone, hydrogen peroxide, $CO_2$, or alcohol ($CH_3OH$, $C_2H_5OH$, $CH_3CH(OH)CH_3$, etc.). As a gas diluting the oxidizing gas, $N_2$, He, Ne, or Ar can be added.

A frequency of the above-mentioned primary radio-frequency power source 7 is preferably 27.12 MHz, but it can be other than this if it is 2 MHz or higher (high frequencies). A frequency of the secondary radio-frequency power source 8 is preferably 400 kHz, but it can be other than this if it is 2 MHz or lower (low frequencies). Selectively, one of two different radio-frequency power sources can be used.

Figure 2:
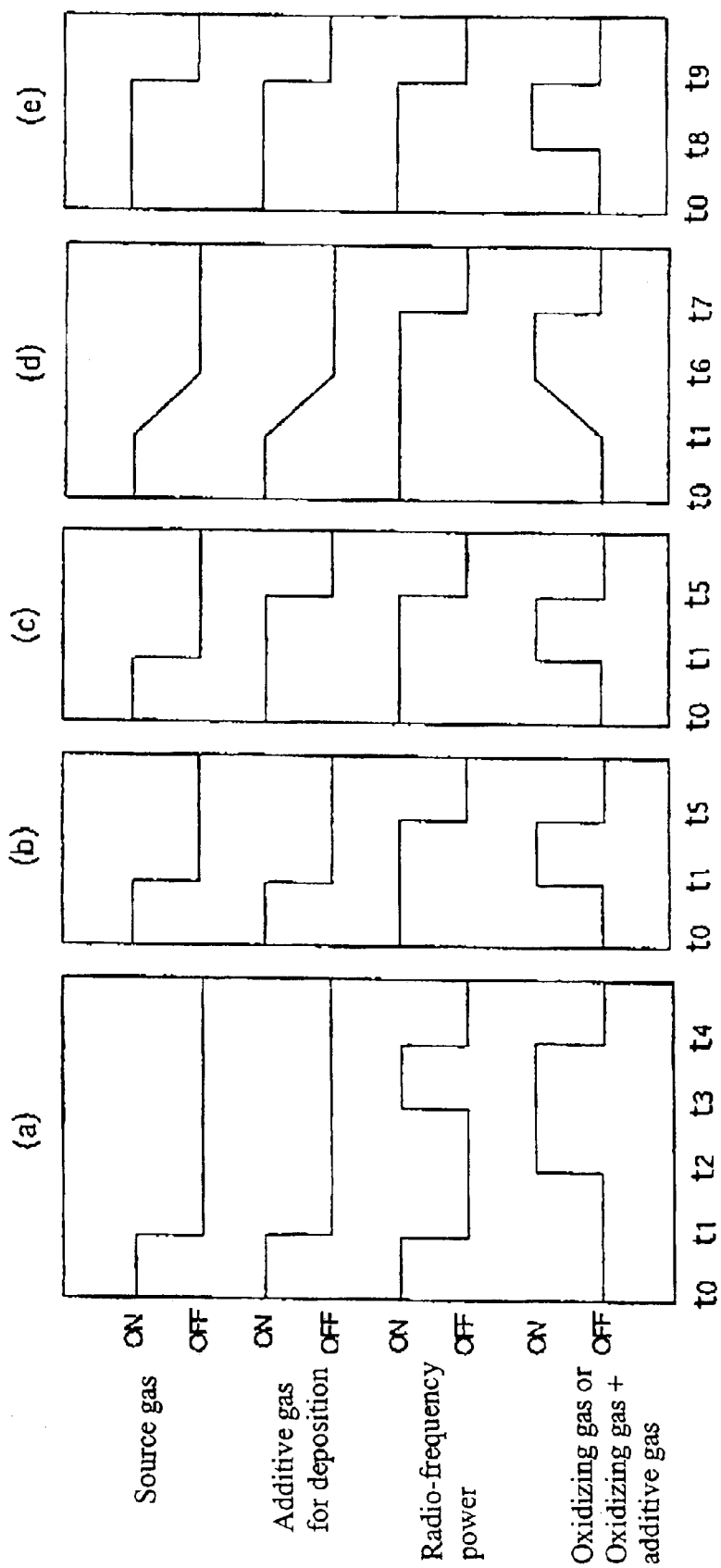
FIG. 2 is a diagram showing processing sequence patterns usable for methods of forming an interlayer insulation film according to the present invention.

The method of forming an interlayer insulation film having high mechanical strength and low water-repellency according to the present invention will be described. FIG. 2 is a diagram showing processing sequence patterns of depositing an interlayer insulation film. In the figure, the time periods indicated are not accurately scaled and do not represent the actual lengths of time periods.

FIG. 2(*a*) shows a sequence pattern of introducing an oxidizing gas and an additive gas for the oxidizing gas after the supply of a source gas and an additive gas for deposition is stopped. At time $t_0$ after the source gas and the additive gas for deposition are brought in, at least one type of radio-frequency power is applied. At time $t_1$, the supply of the source gas and the additive gas for deposition and the application of the radio-frequency power are stopped. At time $t_2$, an oxidizing gas and an additive gas for the oxidizing gas are brought in. At this time, the concentration of the oxidizing gas is preferably 0.3% or higher. At time $t_3$, radio-frequency power is applied again. The power of the radio-frequency power source at this time is preferably 1/10 or higher of the power applied during deposition. Finally, at time $t_4$, the application of the radio-frequency power and the supply of the oxidizing gas and the additive gas for the oxidizing gas are stopped. Processing time $(t_4-t_3)$ of the oxidizing gas is preferably in the range of three seconds to 60 seconds.

In the above, in embodiments, $(t_1-t_0)$ may be approximately 50–200 seconds, $(t_2-t_1)$ may be approximately 3–15 seconds (or 5–10 seconds), $(t_3-t_2)$ may be approximately 3–15 seconds (or 5–10 seconds), and $(t_4-t_3)$ may be approximately 3–60 seconds (or 5–40 seconds).

FIG. 2(*b*) shows a sequence pattern of introducing an oxidizing gas and an additive gas for the oxidizing gas simultaneously with completion of supply of a source gas and an additive gas for deposition. At time to after the source gas and the additive gas for deposition are brought in, at least one type of radio-frequency power is applied. At time $t_1$, simultaneously with the completion of supplying the source gas and the additive gas for deposition, an oxidizing gas and an additive gas for the oxidizing gas are brought in. At this time, the concentration of the oxidizing gas is preferably 0.3% or higher. The power of the radio-frequency power source is preferably 1/10 or higher of the power applied during deposition. Finally, at time $t_4$, the application of the radio-frequency power and the supply of the oxidizing gas and the additive gas for the oxidizing gas are stopped. Processing time $(t_4-t_1)$ of the oxidizing gas is preferably in the range of three seconds to 60 seconds.

In the above, in embodiments, $(t_1-t_0)$ may be approximately 50–200 seconds, and $(t_5-t_1)$ may be approximately 3–60 seconds (or 5–40 seconds).

FIG. 2(*c*) shows another sequence pattern of introducing an oxidizing gas and an additive gas for the oxidizing gas simultaneously with completion of supplying a source gas and an additive gas for deposition. At time to after the source gas and the additive gas for deposition are brought in, at least one type of radio-frequency power is applied. At time $t_1$, simultaneously with the completion of supplying the source gas, an oxidizing gas and an additive gas for the oxidizing gas are brought in. At this time, the concentration of the oxidizing gas is preferably 0.3% or higher. The power of the radio-frequency power source is preferably 1/10 or higher of the power applied during deposition. Finally, at time $t_5$, the supply of the additive gas for deposition, the application of the radio-frequency power, and the supply of the oxidizing gas and the additive gas for the oxidizing gas are stopped. Processing time $(t_5-t_1)$ of the oxidizing gas is preferably in the range of three seconds to 60 seconds.

In the above, in embodiments, $(t_1-t_0)$ may be approximately 50–200 seconds, and $(t_5-t_1)$ maybe approximately 3–60 seconds (or 5–40 seconds).

FIG. 2(*d*) shows a sequence pattern of progressively decreasing supply of a source gas and an additive gas for deposition and increasing a feed amount of an oxidizing gas and an additive gas for the oxidizing gas as the supply of the source gas and the additive gas for deposition is decreased. At time to after the source gas and the additive gas for deposition are brought in, at least one type of radio-frequency power is applied. At time $t_1$, simultaneously with the completion of progressively decreasing supply of the source gas and the additive gas for deposition is started, progressively increasing supply of the oxidizing gas and the additive gas for the oxidizing gas is started. At this time, the concentration of the oxidizing gas is preferably 0.3% or higher. At a time $t_6$, simultaneously when progressively decreasing supply of the source gas and the additive gas for deposition is stopped, progressively increasing a feeding amount of the oxidizing gas and the additive gas for the oxidizing gas is stopped. Time required $(t_6-t_1)$ for gas switching is preferably approximately five seconds. During this time, the power of radio-frequency power source is switched to preferably 1/10 or higher of the power applied during deposition. Finally, at time $t_7$, the application of the radio-frequency power and the supply of the oxidizing gas and the additive gas for the oxidizing gas are stopped. Processing time $(t_{7-t6})$ of the oxidizing gas is preferably in the range of three seconds to 60 seconds.

In the above, in embodiments, $(t_1-t_0)$ may be approximately 50–200 seconds, $(t_{6-t1})$ may be approximately 3–15 seconds (or 5–10 seconds), and $(t_7-t_6)$ may be approximately 3–60 seconds (or 5–40 seconds).

FIG. 2(*e*) shows a sequence pattern of introducing an oxidizing gas and an additive gas for the oxidizing gas immediately before the completion of supplying a source gas and an additive gas for deposition. At time $t_o$ after the source gas and the additive gas for deposition are brought in, at least one type of radio-frequency power is applied. At time $t_8$, an oxidizing gas and an additive gas for the oxidizing gas are brought in. At this time, the concentration of the oxidizing gas is preferably 0.3% or higher. The power of radio-frequency power source is preferably 1/10 or higher of the power applied during deposition. Finally, at time $t_9$, the supply of the source gas and the additive gas for deposition, the application of the radio-frequency power and the supply of the oxidizing gas and the additive gas for the oxidizing gas are stopped. Processing time $(t_9-t_8)$ of the oxidizing gas is preferably in the range of three seconds to 60 seconds.

In the above, in embodiments, $(t_8-t_0)$ may be approximately 50–200 seconds, and $(t_9-t_8)$ may be approximately 3–60 seconds (or 5–40 seconds).

Embodiment

An experiment carried out for evaluating water-repellency of an insulation film formed according to the methods of forming an interlayer insulation film according to embodiments of the present invention is described below. Using the plasma CVD equipment shown in FIG. 1, the experiment was carried out. In the experiment, after a SixCyOz film of 1 μm was deposited on a ⌀300 mm silicon wafer under deposition conditions described below, a contact angle against water of the insulation film obtained by administering processes according to respective sequence patterns shown in FIG. 2 was determined. A contact angle to water here is measured as an angle formed by a silicon wafer and a water droplet (0.01–0.1 cc) at room temperature when the water droplet is dropped on the silicon wafer. The smaller the angle is, the lower the water-repellency of an insulation film becomes. In the experiment described below, a contact angle of no more than 10° to the water droplet was set as an acceptable limit of the water-repellency.

For deposition, the following two conditions were used:
Deposition Condition 1:
DM-DMOS as a main source gas and He as an additive gas were used. The primary excitation radio-frequency power was of 27.12 MHz with output at 2.5 W/cm², the secondary excitation radio-frequency power was of 400 kHz with output at 0 W/cm², and these were not overlaid. A deposition pressure at this time was maintained at 400 Pa. A contact angle of a film obtained is shown as Contact Angle 1.

Deposition Condition 2:
DM-DMOS as a main source gas, 1,2-propanediol as a sub-source gas, and He as an additive gas were used. The primary excitation radio-frequency power was of 27.12 MHz with output at 2.5 W/cm², the secondary excitation radio-frequency power was of 400 kHz with output at 0.1 W/cm², and these were overlaid. A deposition pressure at this time was maintained at 400 Pa. A contact angle of a film obtained is shown as Contact Angle 2.

Experiment 1
Experimental Conditions:
Oxidizing gas: $O_2$
Flow of oxidizing gas: 10 to 100 sccm
Additive gas for oxidizing gas: $N_2$, He, Ar
Concentration of oxidizing gas: 0.3% to 100%
Pressure at oxidizing gas processing: 100 to 800 Pa
Radio-frequency power during oxidizing gas processing is $1/10$ of the power applied at deposition
Oxidizing gas processing time: 1 to 30 seconds
Oxidizing gas processing sequence: FIG. 2(a) to (e)
Time required for gas switching and radio-frequency power switching in the Sequence Pattern shown in FIG. 2(d) ($t_6-t_1$): 5 seconds
With the above-mentioned conditions, conditions under which a contact angle of an insulation film to water becomes within 10° were determined.

TABLE 1

| | FR (sccm) | AG | C (%) | P (Pa) | PS | PT (sec.) | CA 1 (°) | CA 2 (°) |
|---|---|---|---|---|---|---|---|---|
| NT | | | | | | | 60 | 65 |
| 1-1 | 10 | $N_2$ | 0.3 | 400 | (a) | 1 | 25 | 35 |
| 1-2 | 10 | $N_2$ | 0.3 | 400 | (a) | 3 | <10 | <10 |
| 1-3 | 10 | $N_2$ | 0.3 | 400 | (a) | 5 | <10 | <10 |
| 1-4 | 10 | $N_2$ | 0.3 | 400 | (a) | 15 | <10 | <10 |
| 1-5 | 10 | $N_2$ | 0.3 | 400 | (a) | 30 | <10 | <10 |
| 1-6 | 10 | $N_2$ | 0.3 | 100 | (a) | 3 | <10 | <10 |
| 1-7 | 10 | $N_2$ | 0.3 | 800 | (a) | 3 | <10 | <10 |
| 1-8 | 100 | — | 100 | 400 | (a) | 3 | <10 | <10 |
| 1-9 | 10 | He | 0.3 | 400 | (a) | 3 | <10 | <10 |
| 1-10 | 10 | Ar | 0.3 | 400 | (a) | 3 | <10 | <10 |
| 1-11 | 10 | $N_2$ | 0.3 | 400 | (b) | 3 | <10 | <10 |
| 1-12 | 10 | $N_2$ | 0.3 | 400 | (c) | 3 | <10 | <10 |
| 1-13 | 10 | $N_2$ | 0.3 | 400 | (d) | 3 | <10 | <10 |
| 1-14 | 10 | $N_2$ | 0.3 | 400 | (e) | 3 | <10 | <10 |

TABLE 1-continued

| | FR (sccm) | AG | C (%) | P (Pa) | PS | PT (sec.) | CA 1 (°) | CA 2 (°) |
|---|---|---|---|---|---|---|---|---|

NT: No Treatment; FR: Flow Rate; AG: Additive Gas; C: Concentration; P: Pressure; PS: Processing Sequence; PT: Processing Time; CA 1: Contact Angle 1; CA 2: Contact Angle 2.

From the experimental results shown in Table 1, the conditions where an $O_2$ flow rate was 10 to 100 sccm, an $O_2$ concentration was 0.3 to 100% (No additive gas), a pressure was 100 to 800 Pa, radio-frequency power was $1/10$ of that applied at deposition, and a processing time period was 3 to 30 seconds, are preferable. It is seen that under these conditions, the water-repellency of the insulation film is lowered down to the acceptable limit in all sequence patterns.

Experiment 2
Experimental Conditions:
Oxidizing gas: Dinitrogenoxide
Flow of oxidizing gas: 10 to 100 sccm
Additive gas for oxidizing gas: $N_2$, He, Ar
Concentration of oxidizing gas: 0.3% to 100%
Pressure at oxidizing gas processing: 400 Pa
Radio-frequency power during oxidizing gas processing is $1/10$ of the power applied at deposition
Oxidizing gas processing time: 3 to 30 seconds
Oxidizing gas processing sequence: FIG. 2(a) to (e)
Time required for gas switching and radio-frequency power switching in the Sequence Pattern shown in FIG. 2(d) ($t_6-t_1$): 5 seconds
With the above-mentioned conditions, conditions under which a contact angle of an insulation film to water becomes within 10° were determined.

TABLE 2

| | FR (sccm) | AG | C (%) | P (Pa) | PS | PT (Sec.) | CA 1 (°) | CA2 (°) |
|---|---|---|---|---|---|---|---|---|
| NT | | | | | | | 60 | 65 |
| 2-1 | 10 | $N_2$ | 0.3 | 400 | (a) | 3 | <10 | <10 |
| 2-2 | 100 | — | 100 | 400 | (a) | 15 | <10 | <10 |
| 2-3 | 10 | He | 0.3 | 400 | (a) | 3 | <10 | <10 |
| 2-4 | 10 | Ar | 0.3 | 400 | (a) | 3 | <10 | <10 |
| 2-5 | 10 | $N_2$ | 0.3 | 400 | (b) | 3 | <10 | <10 |
| 2-6 | 10 | $N_2$ | 0.3 | 400 | (c) | 3 | <10 | <10 |
| 2-7 | 10 | $N_2$ | 0.3 | 400 | (d) | 30 | <10 | <10 |
| 2-8 | 10 | $N_2$ | 0.3 | 400 | (e) | 3 | <10 | <10 |

From the experimental results shown in Table 2, the conditions where an a dinitrogenoxide flow rate was 10 to 100 sccm, a dinitrogenoxide concentration was 0.3 to 100% (No additive gas), a pressure was 400 Pa, radio-frequency power was $1/10$ of that applied at deposition and processing time of 3 to 30 seconds, are preferable. It is seen that under these conditions, the water-repellency of the insulation film is lowered down to the acceptable limit in all sequence patterns.

Experiment 3
Experimental Conditions:
Oxidizing gas: Ozone
Flow of oxidizing gas: 10 sccm
Additive gas for oxidizing gas: $N_2$
Concentration of oxidizing gas: 0.3%
Pressure at oxidizing gas processing: 400 Pa
Radio-frequency power during oxidizing gas processing is $1/10$ of the power applied at deposition
Oxidizing gas processing time: 3 to 30 seconds.
Oxidizing gas processing sequence: FIG. 2(a) to (e)

Time required for gas switching and radio-frequency power switching in the Sequence Pattern shown in FIG. 2(d) ($t_6-t_0$): 5 seconds With the above-mentioned conditions, conditions under which a contact angle of an insulation film to water becomes within 10° were determined.

TABLE 3

| | FR (sccm) | AG | C (%) | P (Pa) | PS | PT (Sec.) | CA 1 (°) | CA 2 (°) |
|---|---|---|---|---|---|---|---|---|
| NT | | | | | | | 60 | 65 |
| 3-1 | 10 | $N_2$ | 0.3 | 400 | (a) | 15 | <10 | <10 |
| 3-2 | 10 | $N_2$ | 0.3 | 400 | (b) | 3 | <10 | <10 |
| 3-3 | 10 | $N_2$ | 0.3 | 400 | (c) | 3 | <10 | <10 |
| 3-4 | 10 | $N_2$ | 0.3 | 400 | (d) | 3 | <10 | <10 |
| 3-5 | 10 | $N_2$ | 0.3 | 400 | (e) | 30 | <10 | <10 |

From the experimental results shown in Table 3, the conditions where an ozone flow rate was 10 sccm, an ozone concentration was 0.3% or higher, a pressure was 400 Pa, radio-frequency power was 1/10 of that applied at deposition and a processing time period was 3 to 30 seconds, are preferable. It is seen that under these conditions, the water-repellency of the insulation film is lowered down to the acceptable limit in all sequence patterns.

Experiment 4

Experimental Conditions:
Oxidizing gas: Hydrogen peroxide
Flow of oxidizing gas: 10 sccm
Additive gas for oxidizing gas: $N_2$
Concentration of oxidizing gas: 0.3%
Pressure at oxidizing gas processing: 400 Pa
Radio-frequency power during oxidizing gas processing is 1/10 of the power applied at deposition
Oxidizing gas processing time: 3 to 30 seconds
Oxidizing gas processing sequence: FIG. 2(a) to (e)
Time required for gas-switching and radio-frequency power switching in the Sequence Pattern shown in FIG. 2(d) ($t_6-t_1$): 5 seconds With the above-mentioned conditions, conditions under which a contact angle of an insulation film to water becomes within 10° were determined.

TABLE 4

| | FR (sccm) | AG | C (%) | P (Pa) | PS | PT (Sec.) | CA 1 (°) | CA 2 (°) |
|---|---|---|---|---|---|---|---|---|
| NT | | | | | | | 60 | 65 |
| 4-1 | 10 | $N_2$ | 0.3 | 400 | (a) | 3 | <10 | <10 |
| 4-2 | 10 | $N_2$ | 0.3 | 400 | (b) | 5 | <10 | <10 |
| 4-3 | 10 | $N_2$ | 0.3 | 400 | (c) | 3 | <10 | <10 |
| 4-4 | 10 | $N_2$ | 0.3 | 400 | (d) | 30 | <10 | <10 |
| 4-5 | 10 | $N_2$ | 0.3 | 400 | (e) | 15 | <10 | <10 |

From the experimental results shown in Table 4, the conditions where a hydrogen peroxide flow rate was 10 sccm, a hydrogen peroxide concentration was 0.3% or higher, a pressure was 400 Pa, radio-frequency power was 1/10 of that applied at deposition and a processing time period was 3 to 30 seconds, are preferable. It is seen that under these conditions, the water-repellency of the insulation film is lowered down to the acceptable limit in all sequence patterns.

Experiment 5

Experimental Conditions:
Oxidizing gas: $CO_2$
Flow of oxidizing gas: 10 sccm
Additive gas for oxidizing gas: $N_2$
Concentration of oxidizing gas: 0.3%
Pressure at oxidizing gas processing: 400 Pa
Radio-frequency power during oxidizing gas processing is 1/10 of the power applied at deposition
Oxidizing gas processing time: 3 to 30 seconds
Oxidizing gas processing sequence: FIG. 2(a) to (e)
Time required for gas switching and radio-frequency power switching in the Sequence Pattern shown in FIG. 2(d) ($t_6-t_1$): 5 seconds With the above-mentioned conditions, conditions under which a contact angle of an insulation film to water becomes within 10° were determined.

TABLE 5

| | FR (sccm) | AG | C (%) | P (Pa) | PS | PT (Sec.) | CA 1 (°) | CA 2 (°) |
|---|---|---|---|---|---|---|---|---|
| NT | | | | | | | 60 | 65 |
| 5-1 | 10 | $N_2$ | 0.3 | 400 | (a) | 3 | <10 | <10 |
| 5-2 | 10 | $N_2$ | 0.3 | 400 | (b) | 15 | <10 | <10 |
| 5-3 | 10 | $N_2$ | 0.3 | 400 | (c) | 3 | <10 | <10 |
| 5-4 | 10 | $N_2$ | 0.3 | 400 | (d) | 3 | <10 | <10 |
| 5-5 | 10 | $N_2$ | 0.3 | 400 | (e) | 30 | <10 | <10 |

From the experimental results shown in Table 5, the conditions where a $CO_2$ flow rate was 10 sccm, a $CO_2$ concentration was 0.3% or higher, a pressure was 400 Pa, radio-frequency power was 1/10 of that applied at deposition and a processing time period was 3 to 30 seconds, are preferable. It is seen that under these conditions, the water-repellency of the insulation film is lowered down to the acceptable limit in all sequence patterns.

Experiment 6

Experimental Conditions:
Oxidizing gas: $CH_3OH$
Flow of oxidizing gas: 10 sccm
Additive gas for oxidizing gas: $N_2$
Concentration of oxidizing gas: 0.3%
Pressure at oxidizing gas processing: 400 Pa
Radio-frequency power during oxidizing gas processing is 1/10 of the power applied at deposition
Oxidizing gas processing time: 3 to 30 seconds
Oxidizing gas processing sequence: FIG. 2(a) to (e)
Time required for gas switching and radio-frequency power switching in the Sequence Pattern shown in FIG. 2(d) ($t_6-t_1$): 5 seconds With the above-mentioned conditions, conditions under which a contact angle of an insulation film to water becomes within 10° were determined.

TABLE 6

| | FR (sccm) | AG | C (%) | P (Pa) | PS | PT (Sec.) | CA 1 (°) | CA 2 (°) |
|---|---|---|---|---|---|---|---|---|
| NT | | | | | | | 60 | 65 |
| 6-1 | 10 | $N_2$ | 0.3 | 400 | (a) | 15 | <10 | <10 |
| 6-2 | 10 | $N_2$ | 0.3 | 400 | (b) | 3 | <10 | <10 |
| 6-3 | 10 | $N_2$ | 0.3 | 400 | (c) | 3 | <10 | <10 |
| 6-4 | 10 | $N_2$ | 0.3 | 400 | (d) | 30 | <10 | <10 |
| 6-5 | 10 | $N_2$ | 0.3 | 400 | (e) | 3 | <10 | <10 |

From the experimental results shown in Table 6, the conditions where a $CH_3OH$ flow rate was 10 sccm, a $CH_3OH_2$ concentration was 0.3% or higher, a pressure was 400 Pa, radio-frequency power was 1/10 of that applied at deposition and a processing time period was 3 to 30 seconds, are preferable. It is seen that under these conditions, the water-repellency of the insulation film is lowered down to the acceptable limit in all sequence patterns.

Experiment 7

Experimental Conditions:
Oxidizing gas: $C_2H_5OH$
Flow of oxidizing gas: 10 sccm
Additive gas for oxidizing gas: $N_2$
Concentration of oxidizing gas: 0.3%
Pressure at oxidizing gas processing: 400 Pa
Radio-frequency power during oxidizing gas processing is
 $\frac{1}{10}$ of the power applied at deposition
Oxidizing gas processing time: 3 to 30 seconds
Oxidizing gas processing sequence: FIG. 2(a) to (e)
Time required for gas switching and radio-frequency power
 switching in the Sequence Pattern shown in FIG. 2(d)
 ($t_6$–$t_0$): 5 seconds
With the above-mentioned conditions, conditions under which a contact angle of an insulation film to water becomes within 10° were determined.

TABLE 7

| | FR (sccm) | AG | C (%) | P (Pa) | PS | PT (Sec.) | CA 1 (°) | CA 2 (°) |
|---|---|---|---|---|---|---|---|---|
| NT | | | | | | | 60 | 65 |
| 7-1 | 10 | $N_2$ | 0.3 | 400 | (a) | 30 | <10 | <10 |
| 7-2 | 10 | $N_2$ | 0.3 | 400 | (b) | 3 | <10 | <10 |
| 7-3 | 10 | $N_2$ | 0.3 | 400 | (c) | 15 | <10 | <10 |
| 7-4 | 10 | $N_2$ | 0.3 | 400 | (d) | 3 | <10 | <10 |
| 7-5 | 10 | $N_2$ | 0.3 | 400 | (e) | 3 | <10 | <10 |

From the experimental results shown in Table 7, the conditions where a $C_2H_5OH$ flow rate was 10 sccm, a $C_2H_5OH$ concentration was 0.3% or higher, a pressure was 400 Pa, radio-frequency power was $\frac{1}{10}$ of that applied at deposition and a processing time period was 3 to 30 seconds, are preferable. It is seen that under these conditions, the water-repellency of the insulation film is lowered down to the acceptable limit in all sequence patterns.

Experiment 8

Experimental Conditions:
Oxidizing gas: $C_3CH(OH)CH_3$
Flow of oxidizing gas: 10 sccm
Additive gas for oxidizing gas: $N_2$
Concentration of oxidizing gas: 0.3%
Pressure at oxidizing gas processing: 400 Pa
Radio-frequency power during oxidizing gas processing is
 $\frac{1}{10}$ of the power applied at deposition
Oxidizing gas processing time: 3 to 30 seconds
Oxidizing gas processing sequence: FIG. 2(a) to (e)
Time required for gas switching and radio-frequency power
 switching in the Sequence Pattern shown in FIG. 2(d)
 ($t_6$–$t_1$): 5 seconds
With the above-mentioned conditions, conditions under which a contact angle of an insulation film to water becomes within 10° were determined.

TABLE 8

| | FR (sccm) | AG | C (%) | P (Pa) | PS | PT (Sec.) | CA 1 (°) | CA 2 (°) |
|---|---|---|---|---|---|---|---|---|
| NT | | | | | | | 60 | 65 |
| 8-1 | 10 | $N_2$ | 0.3 | 400 | (a) | 3 | <10 | <10 |
| 8-2 | 10 | $N_2$ | 0.3 | 400 | (b) | 3 | <10 | <10 |
| 8-3 | 10 | $N_2$ | 0.3 | 400 | (c) | 15 | <10 | <10 |
| 8-4 | 10 | $N_2$ | 0.3 | 400 | (d) | 3 | <10 | <10 |
| 8-5 | 10 | $N_2$ | 0.3 | 400 | (e) | 30 | <10 | <10 |

From the experimental results shown in Table 8, the conditions where a $C_3CH(OH)CH_3$ flow rate was 10 sccm, a $C_3CH(OH)CH_3$ concentration was 0.3% or higher, a pressure was 400 Pa, radio-frequency power was $\frac{1}{10}$ of that applied at deposition and a processing time period was 3 to 30 seconds, are preferable. It is seen that under these conditions, the water-repellency of the insulation film is lowered down to the acceptable limit in all sequence patterns.

Effects

Using the methods of forming an interlayer insulation film according to the embodiments, an interlayer insulation film having a low dielectric constant, high mechanical strength and low surface water-repellency was formed effectively. With this film, in the CMP process of the Damascene interconnect technology, polishing can be performed evenly, and reliability of insulation can be improved.

Additionally, using the methods of forming an interlayer insulation film according to the embodiments, an interlayer insulation film with low manufactures' cost and high throughput was formed effectively.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method of forming an insulation film on a semiconductor substrate using plasma CVD, which comprises the steps of:
    (a) forming an insulation film on a semiconductor substrate placed in a reaction chamber by introducing a source gas and applying radio-frequency power; and
    (b) solely at completion of the formation of the film, introducing an oxidizing gas into the reaction chamber and applying radio-frequency power to increase hydrophilicity of a surface of the resulting insulation film.

2. The method according to claim 1, wherein the oxidizing gas is introduced with an additive gas.

3. The method according to claim 1, wherein the source gas is introduced with an additive gas.

4. A method of forming an insulation film on a semiconductor substrate using plasma CVD, which comprises the steps of:
    (a) forming an insulation film on a semiconductor substrate placed in a reaction chamber by introducing a source gas and applying radio-frequency power; and
    (b) at completion of the formation of the film, introducing an oxidizing gas into the reaction chamber and applying radio-frequency power to increase hydrophilicity of a surface of the resulting insulation film,
    wherein no oxidizing gas is used in step (a).

5. The method according to claim 1, wherein step (b) is initiated immediately after step (a).

6. A method of forming an insulation film on a semiconductor substrate using plasma CVD, which comprises the steps of:
    (a) forming an insulation film on a semiconductor substrate placed in a reaction chamber by introducing a source gas and applying radio-frequency power; and
    (b) at completion of the formation of the film, introducing an oxidizing gas into the reaction chamber and applying radio-frequency power to increase hydrophilicity of a surface of the resulting insulation film, wherein step (b) is initiated immediately prior to the completion of step (a).

7. A method of forming an insulation film on a semiconductor substrate using plasma CVD, which comprises the steps of:

(a) forming an insulation film on a semiconductor substrate placed in a reaction chamber by introducing a source gas and applying radio-frequency power;

(b) at completion of the formation of the film, introducing an oxidizing gas into the reaction chamber and applying radio-frequency power to increase hydrophilicity of a surface of the resulting insulation film; and (c) evacuating the reaction chamber after step (a) before step (b).

8. The method according to claim 1, wherein step (b) is conducted for approximately 3–60 seconds.

9. The method according to claim 1, wherein step (a) forms a siloxan polymer or oligomer film as the insulation film.

10. A method of forming an insulation film on a semiconductor substrate using plasma CVD, which comprises the steps of:

(a) forming an insulation film on a semiconductor substrate placed in a reaction chamber by introducing a source gas and applying radio-frequency power; and (b) at completion of the formation of the film, introducing an oxidizing gas into the reaction chamber and applying radio-frequency power to increase hydrophilicity of a surface of the resulting insulation film, wherein a ratio of the radio-frequency power in step (b) to that in step (a) is about 1/10 to about 1/1.

11. The method according to claim 1, wherein in step (b), the radio-frequency power is at least 150 mW/cm$^2$.

12. A method of forming an insulation film on a semiconductor substrate using plasma CVD, which comprises the steps of:

(a) forming an insulation film on a semiconductor substrate placed in a reaction chamber by introducing a source gas and applying radio-frequency power; and (b) at completion of the formation of the film, introducing an oxidizing gas into the reaction chamber and applying radio-frequency power to increase hydrophilicity of a surface of the resulting insulation film, wherein step (b) continues until a contact angle to water of the surface of the insulation film becomes 10° or lower.

13. The method according to claim 1, wherein in step (b), the oxidizing gas is used at a concentration of approximately 0.3%–100%.

14. A method of forming an insulation film on a semiconductor substrate using plasma CVD, which comprises the steps of:

(a) forming an insulation film on a semiconductor substrate placed in a reaction chamber by introducing a source gas and applying radio-frequency power; and (b) at completion of the formation of the film, introducing an oxidizing gas into the reaction chamber and applying radio-frequency power to increase hydrophilicity of a surface of the resulting insulation film, wherein the insulation film is an interlayer insulation film and the method further comprises subjecting the surface of the insulation film to chemical mechanical polishing (CMP).

15. A method of forming an interlayer insulation film on a semiconductor substrate using plasma CVD, which comprises the steps of:

introducing a source gas into a reaction chamber;

applying radio-frequency power after the source gas is brought in;

introducing an oxidizing gas with or without an additive gas into the reaction chamber solely after supplying the source gas and applying the radio-frequency power; and reinitiating radio-frequency power.

16. A method of forming an interlayer insulation film on a semiconductor substrate using plasma CVD, which comprises the steps of:

introducing a source gas into a reaction chamber;

applying radio-frequency power after the source gas is brought in; and introducing an oxidizing gas with or without an additive gas into the reaction chamber solely simultaneously with completion of supplying the source gas.

17. A method of forming an interlayer insulation film on a semiconductor substrate using plasma CVD, which comprises the steps of:

introducing a source gas into a reaction chamber;

applying radio-frequency power after the source gas is brought in;

progressively decreasing supply of the source gas; and introducing an oxidizing gas with or without an additive gas into the reaction chamber by progressively increasing a feed rate of the oxidizing gas with or without the additive gas as a feed rate of the source gas decreases.

18. A method of forming an interlayer insulation film on a semiconductor substrate using plasma CVD, which comprises the steps of:

introducing a source gas into a reaction chamber;

applying radio-frequency power after the source gas is brought in; and introducing an oxidizing gas with or without an additive gas into the reaction chamber solely immediately before completion of supplying the source gas and applying the radio-frequency power.

19. The method according to any one of claims 15 to 18, wherein said source gas comprises dimethyl dimethoxysilane (DM-DMOS).

20. The method according to claim 19, wherein said source gas further comprises 1,2-propanediol.

21. The method according to any one of claims 15 to 18, wherein said oxidizing gas comprises at least one selected from the group consisting of oxygen, dinitrogenoxide, ozone, hydrogen peroxide, carbon dioxide, and alcohol.

22. The method according to any one of claims 15 to 18, wherein said oxidizing gas has a concentration of 0.3% to 100%.

23. The method according to any one of claims 15 to 18, wherein the introduction of the oxidizing gas continues for three seconds to 60 seconds.

24. The method according to any one of claims 15 to 18, wherein said additive gas is He, Ar or $N_2$.

25. The method according to claim 21, wherein said alcohol is $CH_3OH$, $C_2H_5OH$ or $CH_3CH(OH)CH_2$.

* * * * *